(12) United States Patent
Bae et al.

(10) Patent No.: US 8,441,008 B2
(45) Date of Patent: May 14, 2013

(54) SOLUTION COMPOSITION FOR MANUFACTURING METAL OXIDE SEMICONDUCTOR

(75) Inventors: Byeong-Soo Bae, Daejeon (KR); Young Hwan Hwang, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 219 days.

(21) Appl. No.: 12/873,436

(22) Filed: Sep. 1, 2010

(65) Prior Publication Data
US 2011/0266536 A1 Nov. 3, 2011

(30) Foreign Application Priority Data
Apr. 28, 2010 (KR) .................. 10-2010-0039284

(51) Int. Cl.
*H01L 29/10* (2006.01)

(52) U.S. Cl.
USPC ............. 257/43; 257/E29.273; 438/104

(58) Field of Classification Search ............ 257/43, 257/E29.273; 438/104
See application file for complete search history.

(56) References Cited

FOREIGN PATENT DOCUMENTS
EP  1324398 A2  7/2003

OTHER PUBLICATIONS

Young Hwan Hwang, et al.; "Low Temperature Annealed Sol-Gel Aluminum Indium Oxide Thin Film Transistors"; IMID 2009 Digest; pp. 396-399.

*Primary Examiner* — Minh-Loan T Tran
(74) *Attorney, Agent, or Firm* — The Webb Law Firm

(57) ABSTRACT

Provided is a solution composition for manufacturing a metal oxide semiconductor including aluminum salts, metal acetylacetonate and a solvent. In addition, provided is a method for manufacturing a metal oxide semiconductor, including: manufacturing a metal oxide semiconductor by performing heat treatment after coating a solution composition for manufacturing the metal oxide semiconductor above a substrate. In addition, provided is a thin film transistor, including: a gate substrate; a metal oxide semiconductor manufactured to be overlapped with the gate substrate; a source electrode electrically connected to the metal oxide semiconductor; and a drain electrode that is electrically connected to the metal oxide semiconductor and faces the source electrode.

8 Claims, 3 Drawing Sheets

SOLUTION COMPOSITION FOR MANUFACTURING METAL OXIDE SEMICONDUCTOR

CROSS-REFERENCE TO RELATED APPLICATIONS

This application claims priority under 35 U.S.C. §119 to Korean Patent Application No. 10-2010-0039284, filed on Apr. 28, 2010, in the Korean Intellectual Property Office, the disclosure of which is incorporated herein by reference in its entirety.

TECHNICAL FIELD

The following disclosure relates to a solution composition for manufacturing a metal oxide semiconductor and a metal oxide semiconductor manufacturing method using the same. Also, the following disclosure relates to a metal oxide semiconductor manufactured by the method and a thin film transistor including the same.

BACKGROUND

A thin film transistor (TFT) is used in diverse fields, more particularly, as a switching and driving device in flat panel display devices such as a liquid crystal display (LCD), an organic light emitting diode display (OLED display) and an electrophoretic display.

The thin film transistor includes a gate electrode connected to a gate line for transferring a scan signal, a source electrode connected to a data line for transferring a signal supplied to a pixel electrode, a drain electrode facing a source electrode and a semiconductor electrically connected to a source electrode and a drain electrode.

The semiconductor is an important element for determining a characteristic of the thin film transistor. Silicon (Si) is most widely used as such a semiconductor. The silicon is divided into amorphous silicon and polycrystal silicon according to crystal formats. Since a cost for manufacturing the amorphous silicon is low and its manufacturing process is simple. However, since charge mobility of the amorphous silicon is low, there is a limit to be used for manufacturing a highly efficient thin film transistor. Since the polycrystal silicon has high charge mobility but requires a process of crystallizing silicon, a manufacturing cost is high and a manufacturing process is complicated. A metal oxide semiconductor may be used to compensate the amorphous silicon and the polycrystal silicon. The metal oxide semiconductor does not require an additional process for crystallizing the semiconductor and may raise the charge mobility according to manufacture processes.

In particular, when a solution process is adopted in manufacturing the metal oxide semiconductor, there is an advantage that it is possible to satisfy the charge mobility required in a display device and other electrical characteristic, remarkably reduce the manufacturing cost, and evenly form a metal oxide semiconductor thin film in a large area.

SUMMARY

An embodiment of the present invention is directed to providing a solution composition for manufacturing a metal oxide semiconductor.

Another embodiment of the present invention is directed to enhancing stability of the solution composition for manufacturing the metal oxide semiconductor.

Still another embodiment of the present invention is directed to providing a method for manufacturing a metal oxide semiconductor thin film using the solution composition, the metal oxide semiconductor thin film and a thin film transistor including the metal oxide semiconductor thin film.

In one general aspect, a solution composition for manufacturing a metal oxide semiconductor includes aluminum salts, metal acetylacetonate and a solvent. In another general aspect, a metal oxide semiconductor manufacturing method includes manufacturing a metal oxide semiconductor by performing a heat treatment after coating the solution composition for manufacturing the metal oxide semiconductor above a substrate.

In still another general aspect, a thin film transistor includes:
  a metal oxide semiconductor manufactured to be overlapped with the gate substrate;
  a source electrode electrically connected to the metal oxide semiconductor; and
  a drain electrode that is electrically connected to the metal oxide semiconductor and faces the source electrode.

The solution composition for manufacturing the metal oxide semiconductor has an advantage that chemical stability is superior and a heat treatment is performed at a lower temperature than that of a prior art in manufacturing the semiconductor.

The present invention will be described in detail hereinafter.

The present invention relates to a solution composition for manufacturing a metal oxide semiconductor including aluminum salts, metal acetylacetonate and a solvent.

The solution composition for manufacturing the metal oxide semiconductor may further include more than one solution stabilizer selected from the group consisting of diketone, amino alcohol and polyamine.

More specifically, the diketone may include diacetyl, hexane-2,5-dione, heptaminol, isoetharine, norepinephrine, propanolamines, sphingosine, diethanolamine or triethanolamine.

The polyamine may include ethylenediamine and 1,4-diaminobutane.

In addition, the present invention may further include any one selected from the group consisting of an alcohol amine compound, an alkyl ammonium hydroxyl compound, an alkyl amine compound, a ketone compound, an acid compound and a basic compound. For example, the present invention may further include at least one selected from the group consisting of monoethanolamine, monoisopropylamine, n,n-methyl ethanolamine, amino ethylethanolamine, dethyleneglycolamine, 2-(aminoethoxy) ethanol, n-t-butylethanolamine, n-t-butyldiethanolamine, tetramethylammoniumhydroxide, methylamine, ethylamine, hydrochloric acid, nitric acid, sulfuric acid, acetic acid, ammonium hydroxide, potassium hydroxide and sodium hydroxide.

The solution stabilizer enhances solubility of other constituents by being included in solution composition for manufacturing metal oxide semiconductors and thus forms a uniform thin film. The solution stabilizer may have different content according to a kind and content of above-mentioned other constituents, but may be contained by about 0.01 to 30% by weight based on total content of the solution composition for manufacturing metal oxide semiconductors. The solution stabilizer may enhance solubility and thin film coating property when the solution stabilizer is contained within the above-mentioned range.

A metal of the metal acetyl-acetonate may be at least one selected from the group consisting of lithium (Li), natrium (Na), potassium (K), rubidium (Rb), cesium (Sc), beryllium (Be), magnesium (Mg), calcium (K), strontium (Sr), barium (Ba), titanium (Ti), zirconium (Zr), hafnium (Hf), vanadium (V), niobium (Nb), tantalum (Ta), chrome (Cr), molybdenum (Mo), tungsten (W), manganese (Mn), technetium (Te), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), cadmium (Cd), mercury (Hg), boron (B), gallium (Ga), indium (In), thallium (Tl), silicon (Si), germanium (Ge), tin (Sn), lead (Pb), phosphorus (P), arsenic (As), antimony (Sb), and bismuth (Bi) and is more preferably indium.

It is preferred to use general metal acetylacetonate in the present invention. When this case is compared with a case that general metal salts or metal acetate is used, there is an advantage that chemical stability of prepared precursor solution is superior.

A negative ion of the aluminum salts may use any one selected from the group consisting of hydroxide, acetate, propionate, acetylacetonate, 2,2,6,6-tetramethyl-3,5-heptanedionate, methoxide, sec-butoxide, 3-butoxide, n-propoxide, i-propoxide, ethoxide, phosphate, alkylphosphate, nitrate, perchlorate, sulfate, alkylsulfonate, penoxide, bromide, iodide, and chloride, more preferably acetylacetonate. When the metal oxide semiconductor is manufactured with the solution composition for manufacturing the metal oxide semiconductor including the aluminum salts and metal acetylacetonate, there are advantages that a heat treatment is processed at a lower temperature than that of the prior art in the manufacturing process and chemical stability is acquired. The negative ion of the aluminum salt exists in a complex state with a solvent.

In the present invention, the solvent may include any one selected from the group consisting of water, tetrahydrofuran, alcohol and ether. More specifically, the solvent may include any one selected from the group consisting of methanol, ethanol, propanol, isopropanol, 2-methoxyethanol, 2-ethoxyethanol, 2-porpoxyethanol, 2-butoxyethanol, methyl solusolve, ethyl cellosolve, diethylene glycol methyl ether, diethylene glycol ethyl ether, dipropylene glycol methyl ether, toluene, xylene, hexane, heptane, octane, ethyl acetate, butyl acetate, diethylene glycol dimethyl ether, diethylene glycol dimethyl ethyl ether, methyl methoxy propionic acid, ethyl ethoxy propionic acid, ethyl lacto acid, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, acetone, methyl isobutyl ketone, cyclohexanone, dimethyl formamide (dmf), n,n-dimethyl acetamide (dmac), diethyl ether, thylene glycol dimethyl ether, diglyme, tetra hydro furan, acetylacetone and acetonitrile.

The present invention provides a metal oxide semiconductor manufacturing method that includes manufacturing a metal oxide semiconductor by performing a heat treatment after coating a solution composition for manufacturing a metal oxide semiconductor above a substrate.

The solution composition for manufacturing metal oxide semiconductors may be stirred before being coated to a substrate. The solution composition is stirred for 1 to 100 hours at room temperature or at temperature of about 100° C. or lower. A stirrer or ultrasonic wave may be used, but it is not limited thereto. The solubility and thin film coating property may be improved by performing the above stirring.

The coating method may be any one selected from the group consisting of spin coating, dip coating, bar coating, screen printing, slide coating, roll coating, slit coating, spray coating, dipping, dip-pen, nano dispensing and inkjet printing. A single coating method or multiple coating methods may be used to improve electrical, mechanical and thermal properties of thin films and get thin films with required thickness.

Subsequently, the solution composition for manufacturing the metal oxide semiconductor coated above the substrate may grow to metal oxide by heat treatment and the heat treatment is executed at 100 to 500° C., which is comparatively low temperature compared to the conventional method. More specifically, the thin film of aluminum metal oxide (AXO) grows through the heat treatment process. The metal (X) may be any one selected from the group consisting of lithium (Li), natrium (Na), potassium (K), rubidium (Rb), cesium (Sc), beryllium (Be), magnesium (Mg), calcium (K), strontium (Sr), barium (Ba), titanium (Ti), zirconium (Zr), hafnium (Hf), vanadium (V), niobium (Nb), tantalum (Ta), chrome (Cr), molybdenum (Mo), tungsten (W), manganese (Mn), technetium (Te), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), cadmium (Cd), mercury (Hg), boron (B), gallium (Ga), indium (In), thallium (Tl), silicon (Si), germanium (Ge), tin (Sn), lead (Pb), phosphorus (P), arsenic (As), antimony (Sb) and bismuth (Bi). Also, aluminum metal oxide as a metal oxide semiconductor may be crystal or amorphous.

In the performing the heat treatment on the solution composition coated above the substrate, an atmosphere may be an air including vacuum, nitrogen, oxygen, hydrogen, and a lot of vapors or a mixture gas thereof. A temperature may be between 100° C. and 500° C.

The present invention provides a metal oxide semiconductor manufactured by the manufacturing method. Also, the present invention includes a gate substrate;

a metal oxide semiconductor manufactured to be overlapped with the gate substrate;

a source electrode electrically connected to the metal oxide semiconductor; and a drain electrode that is electrically connected to the metal oxide semiconductor and faces the source electrode.

The metal oxide semiconductor relates to a thin film transistor manufactured by the metal oxide semiconductor manufacturing method.

Other features and aspects will be apparent from the following detailed description, the drawings, and the claims.

Figure 1:
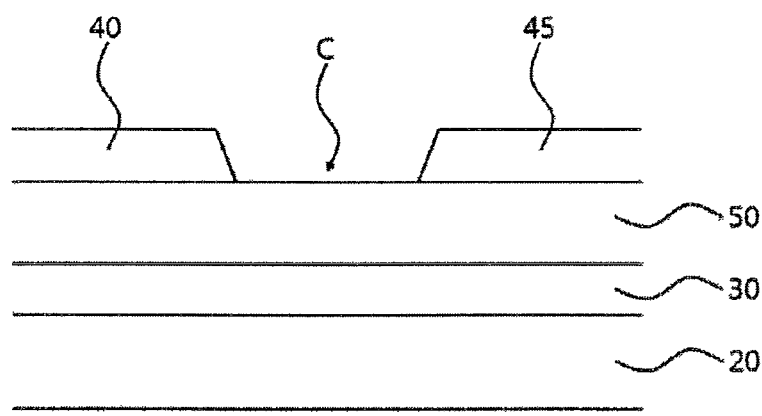
FIG. 1 is a cross-sectional view showing a thin film transistor according to an exemplary embodiment.

| [Detailed Description of Main Elements] | |
|---|---|
| 10: | gate substrate |
| 20: | gate electrode |
| 25: | gate line |
| 30: | gate insulating film |
| 40: | source electrode |
| 45: | drain electrode |
| 50: | metal oxide semiconductor layer |
| 55: | metal oxide semiconductor |
| C: | channel of the thin film transistor |

DETAILED DESCRIPTION OF EMBODIMENTS

Hereinafter, exemplary embodiments will be described in detail with reference to the accompanying drawings such that a person having an ordinary skill in the art may easily realize the present invention. However, the present invention may be realized in diverse forms and is not limited to the exemplary embodiments.

Hereinafter, the thickness of thin films is magnified to clearly express several layers and areas in the drawings. Similar portions through the entire specification have the same reference number. When it is said that the part of the layer, film, area and plate is positioned "above" other part, this includes the case that it is positioned "just above" other part as well as the case that it is positioned above another part of the middle. On the contrary, when it is said that any part is positioned "just above" other part, it means that there is no other part in the middle.

Example 1

Preparation of Solution Composition for Manufacturing Metal Oxide Semiconductor

Aluminum acetylacetonate of 0.001 mol and indium acetylacetonate of 0.002 mol were added to a solvent of 2-methoxyethanol (20 ml) and the mixture was stored to help smooth reaction. Accordingly, a solution composition for manufacturing a metal oxide semiconductor was prepared.
Fabrication of Thin Film Transistor FIG. 1 is a cross-sectional view showing a thin film transistor according to the present invention.

Figure 4:
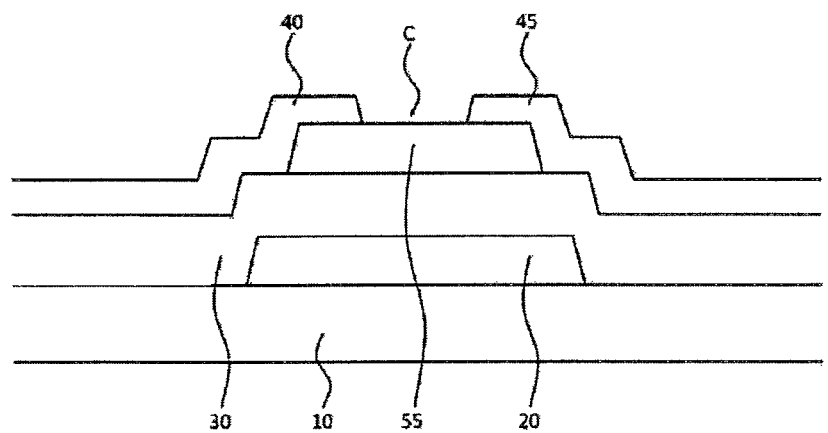
FIG. 4 is a cross-sectional view showing the thin film transistor taken along the line V-V' in FIG. 3.

With reference to FIG. 1, the thin film transistor according to the example of the present invention forms a gate insulating film 30, which covers an entire surface of a gate substrate 10, above the gate substrate 10 as shown in FIG. 4.

The gate substrate 10 includes silicon (Si) doped with p-type or n-type impurities at high concentration and has conductivity.

The gate insulating film 30 includes silicon oxide ($SiO_x$) or silicon nitride ($SiN_x$).

A metal oxide semiconductor layer 50 formed by the solution composition according to the example of the present invention was formed above the gate insulating film 30.

The metal oxide semiconductor layer 50 may be formed with an oxide including aluminum (Al) and indium (In).

A source electrode 40 and a drain electrode 45 facing each other were formed above the metal oxide semiconductor layer 50. The source electrode 40 and the drain electrode 45 were electrically connected to the metal oxide semiconductor layer 50 and a channel C of the thin film transistor was formed above the metal oxide semiconductor layer 50 between the source electrode 40 and the drain electrode 45.

Figure 2:
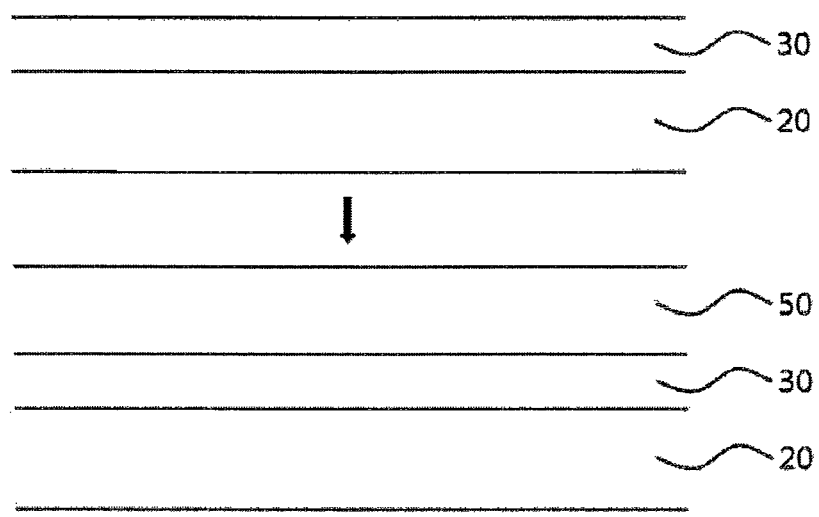
FIG. 2 is a cross-sectional view showing a method for manufacturing the thin film transistor of FIG. 1.

FIG. 2 is a cross-sectional view showing a method for preparing the thin film transistor of FIG. 1 in order. The gate insulating film 30 formed of silicon oxide ($SiO_x$) was fabricated by oxidizing a top portion of the gate substrate 10, which was formed of silicon (Si) doped with an n-type impurity at high concentration, at temperature of 1000° C. Differently from the above method, the gate insulating film 30 may be fabricated by depositing silicon oxide ($SiO_x$), silicon nitride ($SiN_x$) or an organic insulating film above the gate substrate 10.

The prepared solution composition for manufacturing the metal oxide semiconductor was stirred at room temperature for 24 hours and spin coating was performed above the gate insulating film 30. Subsequently, heat treatment was performed in the air at temperature of 350° C. to form the metal oxide semiconductor layer 50.

With reference to FIG. 1, a conductive layer was formed above the metal oxide semiconductor layer 50 according to a sputtering or thermal evaporation method and photo etching was performed, thereby forming the source electrode 40 and the drain electrode 45. In the example of the present invention, the conductive layers were deposited according to the sputtering method. The source electrode 40 and the drain electrode 45 were electrically connected to the metal oxide semiconductor layer 50 and the channel C of the thin film transistor was fabricated above the metal oxide semiconductor layer 50 between the source electrode 40 and the drain electrode 45.

Example 2

Preparation of Solution Composition for Manufacturing Metal Oxide Semiconductor

Example 2 was performed in the same manner as the Example 1.
Fabrication of Thin Film Transistor Hereinafter, the thin film transistor of Example 2 will be described with reference to FIGS. 3 and 4.

Figure 3:
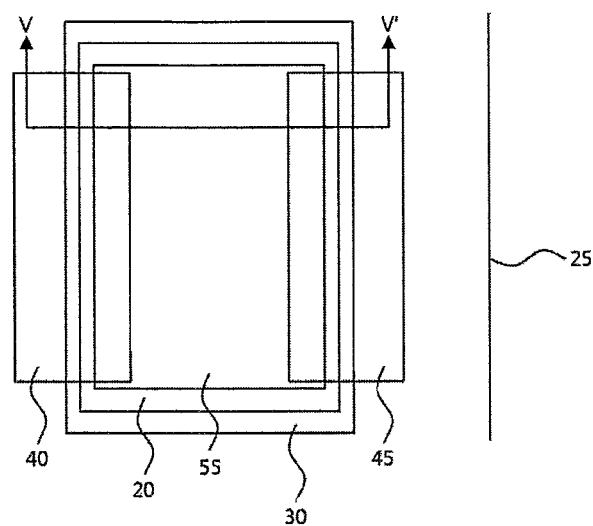
FIG. 3 is a diagram showing arrangement of the thin film transistor according to Example 2.

FIG. 3 is a view showing an arrangement of the thin film transistor according to Example 2 and FIG. 4 is a cross-sectional view of the thin film transistor taken along the line V-V' in FIG. 3.

The same reference number is given to the same constituent element as that in the examples described above and the same description will not be provided again.

A method for fabricating the thin film transistor will be described with reference to FIGS. 3 and 4. a gate line 25 including a gate electrode 20 was formed by depositing a gate conductive layer with any one selected from the group consisting of aluminum based metal, silver based metal, copper based metal, molybdenum based metal, chrome (Cr), tantalum (Ta), titanium (Ti) and silicon (Si) doped with p-type or n-type impurities at high concentration above the insulating gate substrate 10 and patterning the gate conductive layer In Example 2 of the present invention, the gate line 25 including the gate electrode 20 was fabricated by depositing a gate conductive layer with silicon (Si) and patterning the gate conductive layer.

The gate insulating film 30 was formed by depositing silicon oxide ($SiO_x$), silicon nitride ($SiN_x$) or an organic insulating film above the gate line 25. In this example, a gate insulating film was formed by depositing silicon oxide.

After stirring the prepared solution composition for manufacturing the metal oxide semiconductor at room temperature for 24 hours, performing spin coating on the solution composition above the gate insulating film 30, a metal oxide semiconductor layer was formed through heat treatment at temperature of 350° C. and a metal oxide semiconductor 55 was fabricated through patterning. Subsequently, the source electrode 40 and the drain electrode 45 were fabricated by performing patterning after depositing a conductive layer above the metal oxide semiconductor 55 according to a sputtering method.

Example 3

Preparation of Solution Composition for Manufacturing Metal Oxide Semiconductor

Aluminum acetylacetonate of 0.001 mol, indium acetylacetonate of 0.002 mol, and monoethanolamine of 0.004 mol were added to a solvent of 2-methoxyethanol 2-methoxyethanol (20 ml) and a mixture was stirred to help smooth reaction. As a result, a solution composition for manufacturing metal oxide semiconductor was prepared.
Fabrication of Thin Film Transistor
A thin film transistor was fabricated in the same manner as Example 1 but there was a difference that the solution composition prepared in Example 3 was used for the solution composition for manufacturing the metal oxide semiconductor.

Comparative Example 1

Preparation of Solution Composition for Manufacturing Metal Oxide Semiconductor

Aluminum acetylacetonate of 0.001 mol and indium acetate of 0.002 mol were added to a solvent of 2-methoxyethanol (20 ml) with ethylenediamine of 0.008 mol as a solution stabilizer to prepare a solution.
Fabrication of Thin Film Transistor
The thin film transistor was fabricated in the same manner as Example 1 but there was a difference that the solution composition prepared in Comparative Example 1 was used for the solution composition for manufacturing the metal oxide semiconductor.

Test Example

Figure 5:
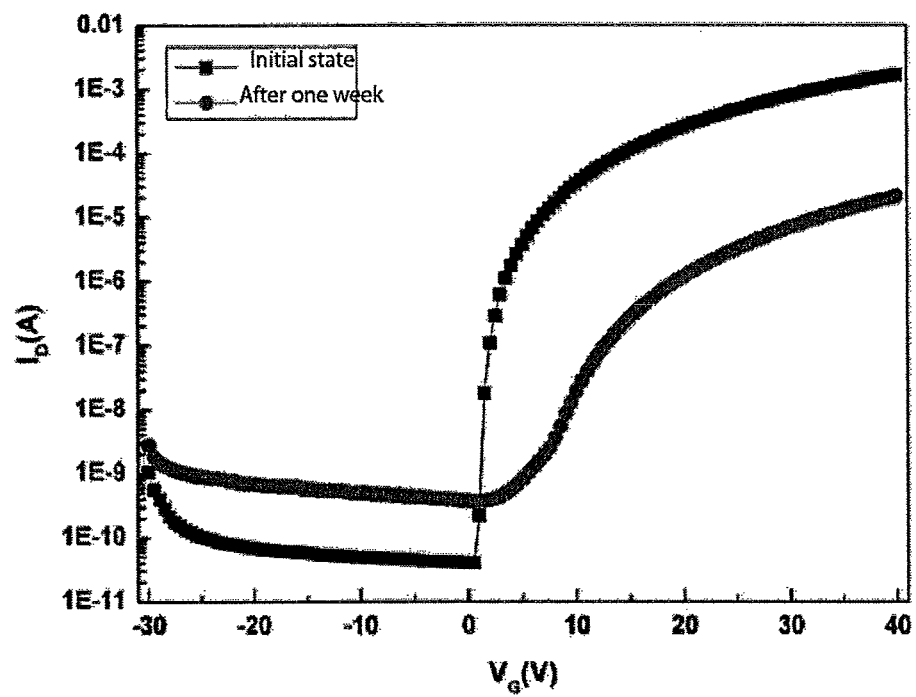
FIG. 5 is a graph showing a voltage-current characteristic of the thin film transistor according to Comparative Example 1 and chemical instability of a precursor solution.
Figure 6:
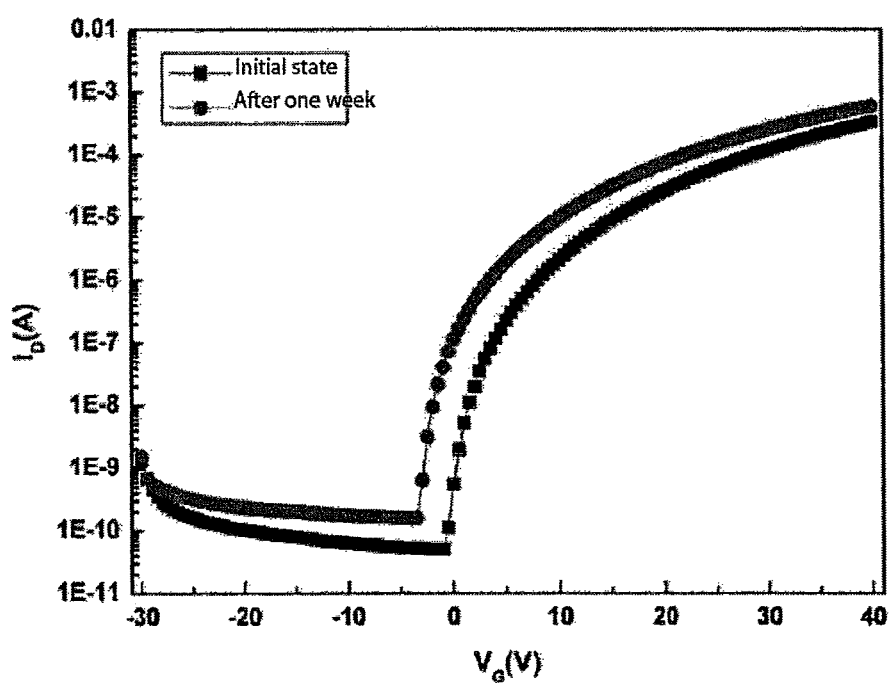
FIG. 6 is a graph showing a voltage-current characteristic of the thin film transistor according to Example 1.

In order to evaluate chemical stability of the solution composition for manufacturing the metal oxide semiconductor of the Example 1 and Comparative Example 1, a reaction time was respectively set as 3 hours and one week, and showed the result in FIGS. 5 and 6 after fabricating a thin film transistor and analyzing electrical properties of current according to the voltage. The manufactured element varied the voltage applied to a gate electrode in a range of −30V~40V after the voltage of 40V was fixed in the source and drain electrode, and the electrical property of a thin film was analyzed by measuring the amount of current flowing between the source and drain electrode. In FIGS. 5 and 6, an initial state graph showed an analysis result of electrical properties according to voltage by manufacturing a thin film transistor right after the solution composition for manufacturing the metal oxide semiconductor of Example 1 and Comparative Example 1 were respectively prepared. A graph after one week showed an analysis result of electrical properties by manufacturing a thin film transistor after one week from the day that the solution compositions for manufacturing the metal oxide semiconductor of Example 1 and Comparative Example 1 were respectively prepared.

FIG. 5 is a graph showing voltage/current properties of the thin film transistor according to Comparative Example 1 and chemical instability of its precursor solution.

FIG. 6 is a graph showing voltage/current properties of the thin film transistor according to Example 1.

According to FIGS. 5 and 6, it was understood that the Example 1 and Comparative Example 1 showed sufficiently high on current (ID) and saturation mobility, and a high on-off current ratio of more than 107 in the initial state.

Also, it was understood that as threshold voltages of the thin film transistor were respectively about 8V and 10V, it was operated in an enhancement mode.

However, it was known that as the thin film transistor fabricated by using the solution composition for manufacturing the metal oxide semiconductor, which passed one week from its manufacturing day, generated negative effects such as remarkable reduction of the on current and on-off ratio, compared to the initial state, there was a problem in chemical stability of the solution composition for manufacturing the metal oxide semiconductor.

On the contrary, in case of the thin film transistor according to Example 1, it was seen that as the electrical properties of the thin film transistor respectively fabricated by the initial solution composition for manufacturing the metal oxide semiconductor and the solution composition for manufacturing the metal oxide semiconductor that one week passed were almost the same and within an error range, the stability of the solution composition for manufacturing the metal oxide semiconductor of Example 1 was much improved compared to Comparative Example 1. The stability of the solution composition for manufacturing the metal oxide semiconductor prepared by a method suggested in the present invention is secured for more than 90 days at room temperature, normal pressure and in the air.

Accordingly, it is considered that the metal oxide semiconductor manufactured by the solution composition for manufacturing the metal oxide semiconductor according to one example of the present invention has a semiconductor characteristic and superior chemical stability.

Table 1 shows detailed electrical properties of Example 1 and Comparative Example 1 as below.

In the Example described above, applying the metal oxide semiconductor to the thin film transistor is exemplarily described but the present invention is not limited thereto. The metal oxide semiconductor may be identically applied to any element requiring a semiconductor thin film. In addition, although only the thin film transistor of a bottom gate structure is exemplarily described in the Example, the present invention is not limited thereto and the metal oxide semiconductor may be identically applied to thin film transistors of any structure such as a thin film transistor of a top gate structure.

TABLE 1

| Division | Charge Mobility | On-off Current Ratio | Subthreshold Swing |
|---|---|---|---|
| Example 1 (Initial state) | 7.74 $cm^2v^{-1}s^{-1}$ | >$10^7$ | 0.9 V/dec |
| Example 1 (After one week) | 10.1 $cm^2v^{-1}s^{-1}$ | >$10^7$ | 0.9 V/dec |
| Comparative Example 1 (Initial state) | 10.9 $cm^2v^{-1}s^{-1}$ | >$10^7$ | 0.5 V/dec |
| Comparative Example 1 (After one week) | 0.3 $cm^2v^{-1}s^{-1}$ | >$10^3$ | 2.7 V/dec |

There are benefits that the solution composition for manufacturing the metal oxide semiconductor according to the present invention is chemically stable and shows an excellent semiconductor characteristic although heat treatment is performed at low temperature when the metal oxide semiconductor is prepared with the solution composition. Also, since the solution composition exists in solution form, there are benefits that the semiconductor manufacturing process is simplified and the semiconductor manufacturing cost is lowered.

In addition, when the solution composition for manufacturing metal oxide semiconductors according to the present invention includes a solution stabilizer, a coating property of the thin film is improved and a uniform thin film is fabricated.

Although preferred examples of the present invention are described in detail above, it will be apparent that the scope of the present invention is not limited thereto and diverse modifications and improved formats by a person having an ordinary skill in the art based on the basic concept of the present invention are also included in the scope of the present invention.

What is claimed is:

1. A solution composition for manufacturing a metal oxide semiconductor comprising:
   aluminum salts;
   at least one metal acetylacetonate selected from the group consisting of indium (In), gallium (Ga), and tin (Sn);
   at least one solution stabilizer selected from the group consisting of diketone, amino alcohol, and polyamine; and
   a solvent.

2. The solution composition of claim 1, wherein a negative ion of the aluminum salts is at least one selected from the group consisting of hydroxide, acetate, propionate, acetylacetonate, 2,2,6,6-tetramethyl-3,5-heptandionate, methoxide, sec-butoxide, 3-butoxide, n-propoxide, i-propoxide, ethoxide, phosphate, alkylphosphate, nitrate, perchlorate, sulfate, alkylsulfonate, penoxide, bromide, iodide, and chloride.

3. The solution composition of claim 1, wherein the solvent is at least one selected from the group consisting of water, tetrahydrofuran, alcohol, and ether.

4. A method for manufacturing a metal oxide semiconductor, comprising: manufacturing a metal oxide semiconductor by performing heat treatment after coating a solution composition for manufacturing a metal oxide semiconductor selected from claim 1 above a substrate.

5. The method of claim 4, wherein the heat treatment is performed at temperature of 100 to 500° C.

6. The method of claim 4, wherein the coating method is any one selected from the group consisting of spin coating, dip coating, bar coating, screen printing, slide coating, roll coating, slit coating, spray coating, dipping, dip-pen, nano dispensing and inkjet printing.

7. A metal oxide semiconductor manufactured according to claim 4.

8. A thin film transistor, comprising:
   a gate substrate;
   a metal oxide semiconductor manufactured according to claim 4 to be overlapped with the gate substrate;
   a source electrode electrically connected to the metal oxide semiconductor; and
   a drain electrode that is electrically connected to the metal oxide semiconductor and faces the source electrode.

* * * * *